Jan. 14, 1964 J. L. WALSH 3,118,073

NON-SATURATING INVERTER FOR LOGIC CIRCUITS

Filed Oct. 5, 1961 2 Sheets-Sheet 1

INVENTOR
J.L. WALSH

BY Joseph C. Redmond Jr.

ATTORNEY

FIG.5
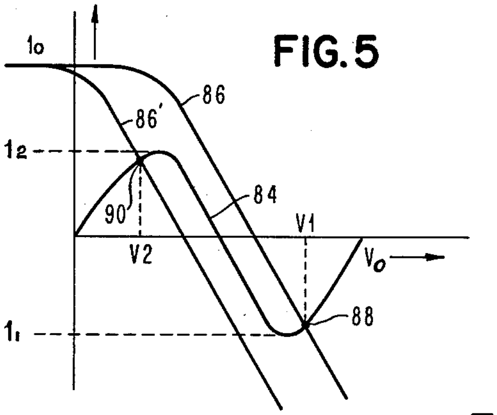
FIG.6
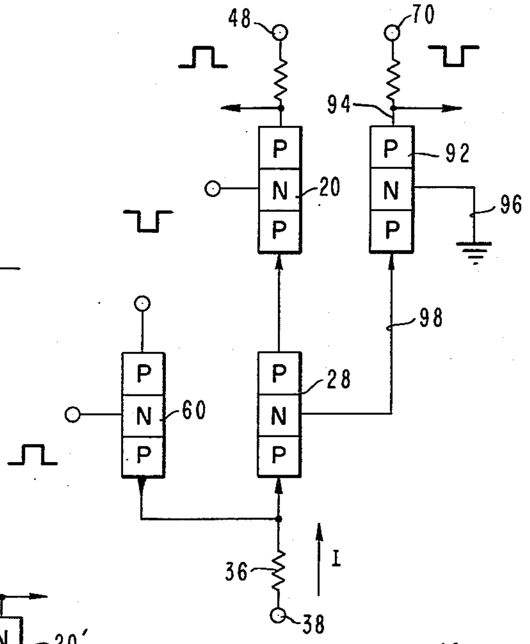
FIG.7
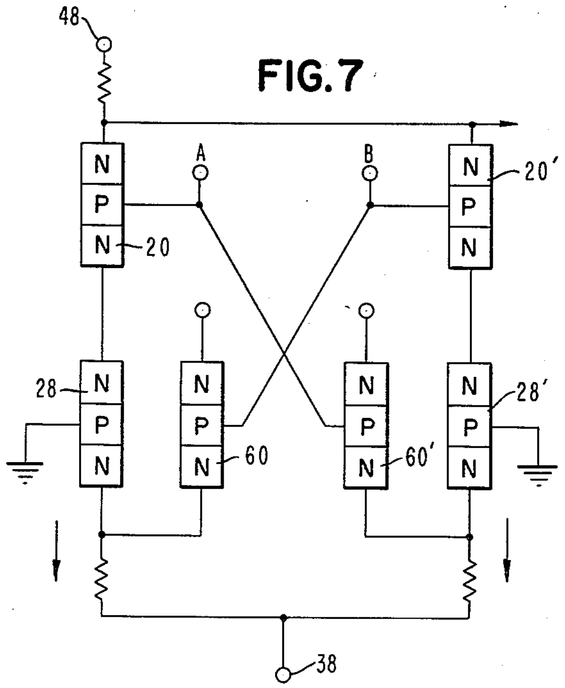
FIG.8
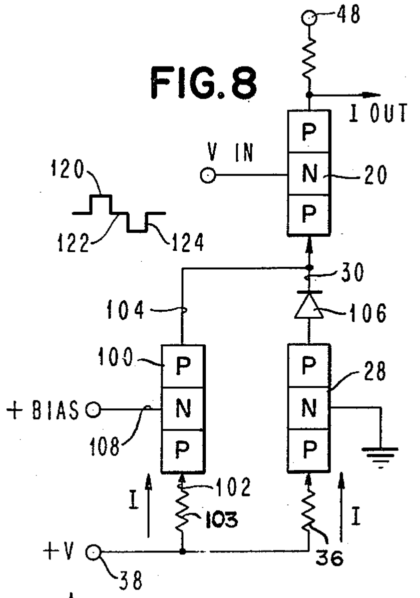
FIG.7A
| INPUT | | OUTPUT |
|---|---|---|
| A | B | |
| 0 | 0 | 0 |
| 0 | 1 | 1 |
| 1 | 1 | 0 |
| 1 | 0 | 1 |
FIG.9
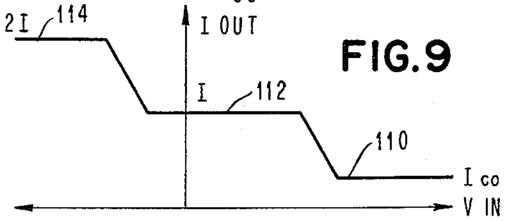

United States Patent Office 3,118,073
Patented Jan. 14, 1964

3,118,073

NON-SATURATING INVERTER FOR LOGIC CIRCUITS

James L. Walsh, Hyde Park, N.Y., assignor to International Business Machines Corporation, New York, N.Y., a corporation of New York Filed Oct. 5, 1961, Ser. No. 143,075
11 Claims. (Cl. 307—88.5)

This invention relates to switching circuits and more particularly to non-saturating transistor switching circuits.

The advantages of non-saturating transistor switching circuits, i.e., those circuits without excess minority carrier storage, are well-known to workers skilled in the art. Circuits have been disclosed that include unidirectional conducting devices that limit base current or collector voltage or both for the transistor to those operating values outside the saturation region. Such circuits, however, are not independent of the input signal. When sufficiently overdriven, the unidirectional conducting devices saturate to the point where they can no longer retain the transistor outside the saturation region. Thus, switching times of the transistor are increased. Returning the unidirectional conducting device to the non-conducting state so that thereafter the transistor can switch further increases the switching time of the transistor. Overdrive, however, can decrease the turn-on and turn-off time of the transistor. The use of overdrive without saturating the transistor has obvious advantages. Additionally, if the transistor output current can be made independent of the input signal, such a circuit can be designed to operate at low power dissipation rates. It is desirable, therefore, to develop a transistor switching circuit which when overdriven, will not saturate or vary the output current so that the switching time of the transistor will be rapid and the power dissipation thereof will be relatively low.

A general object of the invention is an improved non-saturating transistor switching circuit permitting a considerable amount of overdrive and an output signal substantially independent of the input signal.

One object is a transistor switching circuit which is conveniently convertible to various logic circuits.

Another object is a non-saturating inverter circuit having a controlled output current and a rapid turn-on and turn-off time.

Another object is a transistor switching circuit that has a relatively low power dissipation and includes relatively few components.

Another object is a high-speed switching circuit having a controlled output current and providing true and complement output signals.

Still another object is a transistor switching circuit suitable for packaging as a solid logic circuit element.

These and other objects of the present invention are accomplished in the present invention, one illustrative embodiment of which comprises a common emitter amplifier having a common base amplifier connected in its emitter circuit as a controlled current source. Input signals are supplied to the base of the common emitter amplifier. Output signals appear at the collector thereof. Normally, the common emitter amplifier is cut off and the common base amplifier is biased into a saturating condition. The common emitter amplifier appears as an infinite load to the common base amplifier and very little current flows through the former. When the common emitter amplifier is turned on, the common base amplifier is pulled out of saturation by the former. Initially, during turn-on the common emitter amplifier behaves like a conventional inverter, the output current rising toward that of a conventional inverter which is essentially short circuited. As the common base amplifier goes out of saturation, however, the output current becomes clamped to the reverse biased collector current of the common base amplifier. Since the common base amplifier is driven out of saturation, the input signal may be overdriven to decrease the turn-on time of the common emitter amplifier. Furthermore, since the output current is principally determined by the current through the common base amplifier and not the input current, the bias voltage can be made relatively small and the power dissipation of the circuit reduced to a relatively low value. Removal of the input pulse returns the common emitter amplifier to the non-conducting condition. Turn-off time of the common emitter amplifier is reduced since the common base amplifier is returned to saturation and the emitter of the former becomes essentially grounded enabling a large turn-off current to flow from the output source.

A feature of the present invention is a saturated transistor amplifier connected in series with one electrode of a second amplifier, the saturated amplifier limiting the current flow through the second amplifier when turned on and aiding the flow of a relatively large turn-off current in the second amplifier.

Another feature is a common emitter amplifier and a common base amplifier, the latter being connected in the emitter circuit of the former and permitting a sufficient amount of overdrive to aid in the turn-on and turn-off of the common emitter amplifier.

Another feature is a transistor inverter circuit connected at its emitter electrode to a controlled current supply so that the inverter operates outside its saturation region and the output current is independent of any turn-on signal applied to the inverter.

Another feature is a transistor normally operated in a saturated condition and having a load impedance connected in the output circuit thereof, said load impedance including means for varying the current requirements of the load to drive the transistor from a saturated to a non-saturated current to provide a controlled current in the output circuit.

Another feature is a plurality of transistor amplifiers, each amplifier being connected to a controlled current supply and adapted to receive an input signal to provide an output signal, the inverse of the input, and means connected to said controlled current supply for inhibiting the output signal as well as providing a second output signal identical to the input signal.

Another feature is a non-saturating inverter having a plurality of controllable current supplies in the emitter circuit thereof, said controllable current supplies being common base amplifiers operated in the saturated condition and at different bias levels so that the inverter may be employed for ternary logic operation.

Another feature is an inverter having a common base amplifier in the emitter circuit thereof, the latter being operated in the saturated condition so that when the inverter is turned on, the inverter output current is clamped to a value equal to the collector current of the common base amplifier times the emitter-collector current gain for the inverter circuit.

The foregoing and other objects, features and advantages of the invention will be apparent from the following more particular description of preferred embodiments of the invention as illustrated in the accompanying drawings.

Figures 1, 2, 3, 4:
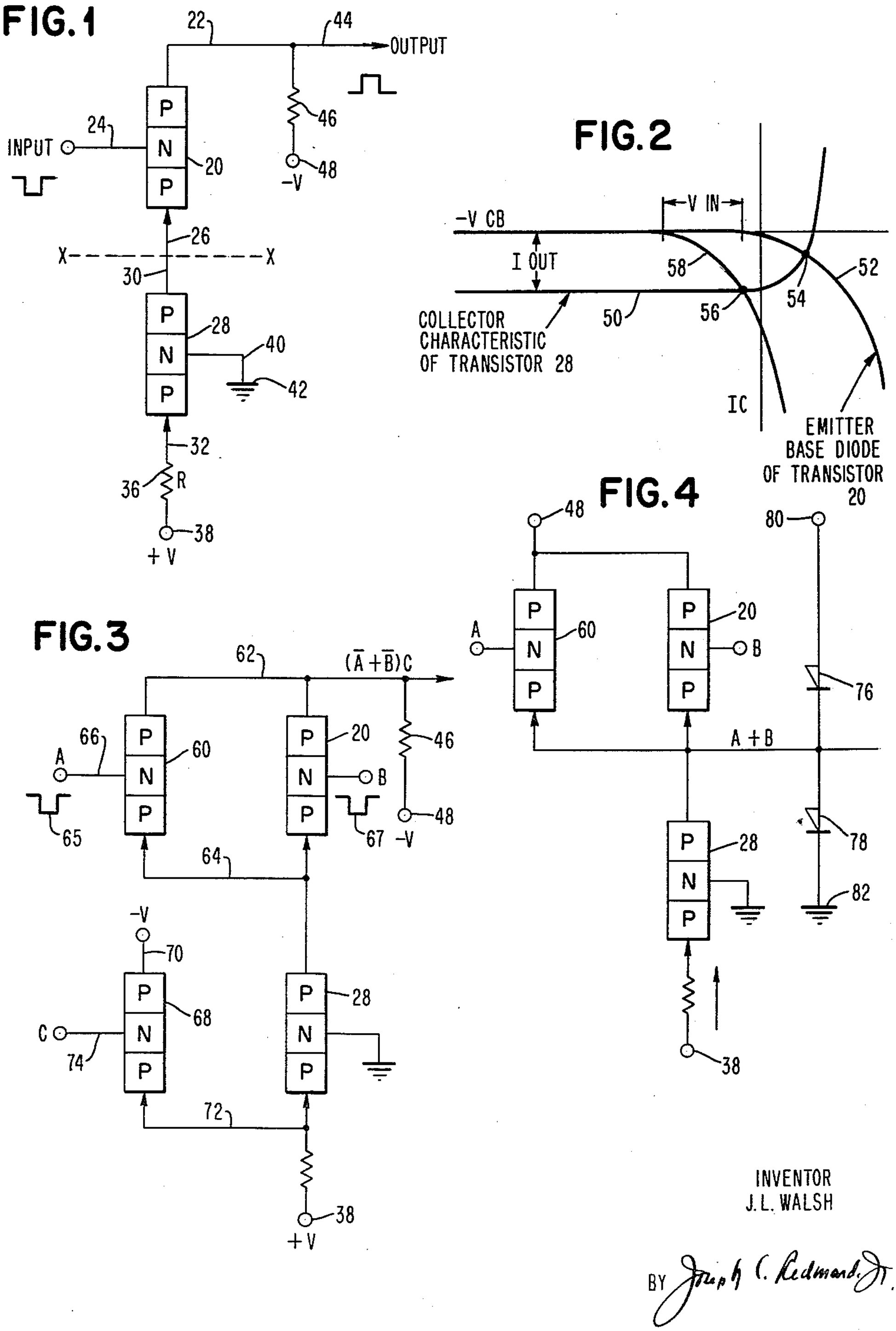
FIG. 1 is an electrical schematic of one embodiment of the present invention including a first and second amplifier for inverting an input signal.
FIG. 2 is a graph of collector current versus collector base voltage of the second amplifier included in FIG. 1.
FIG. 3 is an electrical schematic of the circuit of FIG. 1 arranged as a NOR circuit.
FIG. 4 is an electrical schematic of the circuit of FIG. 1 and arranged to provide a true output instead of an inverted or complemented output.

FIG. 5 is a graph of output current versus output voltage for the circuit of FIG. 4.

FIG. 6 is an electrical schematic of FIG. 1 and arranged to provide both true and complement output signals.

FIG. 7 is an electrical schematic of the circuit of FIG. 1 adapted to perform an Exclusive OR operation.

FIG. 7A is a tabulation of input and output signals for the circuit of FIG. 7.

FIG. 8 is an electrical schematic of another embodiment of the present invention employing first, second and third amplifiers to provide a three-level output signal.

FIG. 9 is a graph of input voltage versus output current for the circuit of FIG. 8.

Referring to FIG. 1, a transistor 20 having a collector 22, base 24 and emitter 26 is connected in a common emitter configuration, the collector 22 being connected to an output circuit 44 and through a load resistor 46 to a supply 48 of suitable polarity. The emitter electrode 26 is connected through a transistor 28, a resistor 36 to voltage supply 38 of suitable polarity. The transistor 28 includes a collector 30 which is directly connected to the emitter 26 of the transistor 20, an emitter 32 which is connected through the resistor 36 to the voltage supply 38, and a base electrode 40 which is connected to a reference potential 42, typically ground. For PNP transistors, which have been arbitrarily chosen for purposes of description, the magnitude of the supply voltage is selected to be sufficiently greater than the base potential to bias the transistor 28 into saturation. The transistor 20, however, is biased non-conducting due to the signal level applied to the base electrode 24. As a result, the non-conducting transistor appears as an infinite load to the saturated transistor and very little to no current flows to the output circuit 44.

The current distribution within the inverter may be better appreciated by considering FIG. 2 wherein the collector current and voltage of transistor 28 are plotted along the line X—X′ with the emitter-base diode of the transistor 20 as the load for the transistor 28.

The collector current-collector voltage relationship for the transistor 28 appears in FIG. 2 as curve 50. The load for the transistor 28, as previously indicated, is the emitter base diode of the transistor 20, the load appearing as curve 52 in FIG. 2. The curve 52 intersects the curve 50 to establish an operating point 54 for the transistor 28. The operating point 54 is in the saturation region of the transistor 28, but $I_0$ the output current, is substantially zero. When an input pulse is applied to the base electrode 24, the emitter base diode curve 52 is shifted toward the constant current region of the curve 50. An operating point 56 is established which is in the non-saturating region of the transistor 28. The difference between the intersection of the curves 52 and 58 with the collector-base voltage coordinate establishes the magnitude of the applied input signal. This difference is sufficient to turn on the transistor 20 and to maintain the transistor 28 in the non-saturated condition. As a result, the output current appearing at the collector 22 is equal to the collector current for the transistor 28 times the current amplification factor $\alpha$ for the transistor 20. The output current is substantially clamped to this value because of the characteristics of the transistor 28. Clamping the output current to the value previously indicated permits the transistor 20 to be overdriven for fast turn-on. It will be apparent that if the transistor 20 is overdriven, the emitter base diode curve will be further shifted along the constant current line of the curve 50 without any change in the output current. Since the output current is substantially independent of the input voltage, the supply voltage 38 may be relatively small so that the power dissipation in the circuit can be relatively low. For supply voltages proportional to 10 times the signal swing at the input to transistor 20, a power dissipation of 10 to 20 milliwatts is achieved. Such a low power dissipation rate facilitates packaging a large quantity of circuits in a small volume, thereby aiding the design of large scale information handling apparatus.

When the input signal is removed, the transistor 28 returns to the operating point 54 which is in the saturation region of the transistor. Since the collector current for the transistor is substantially zero, the minority carriers in the collector base region of the transistor 20 are swept out rapidly by the bias voltage of the source 48. Additionally, the emitter 26 becomes grounded thereby permitting a large turn-off current to flow to ground from the input source connected to the base 24. Output current, as a result, terminates abruptly which reduces the turn-off time of the transistor. It will be apparent, therefore, that returning the transistor 28 to saturation or forward biasing the collector base junction thereof, overdrives the turn-off of the transistor 20.

Thus, the circuit of FIG. 1 has a controlled output current and a reduced turn-on and turn-off time due to the transistor 28 being driven alternately into and out of saturation. Additionally, the transistor 28 renders the output current independent of the input signal which permits low supply voltages to be employed in the circuit with resultant reduced power dissipation rates for the circuit. The basic circuit shown in FIG. 1 is conveniently convertible to perform a wide variety of logic functions. The remaining paragraphs of the specification will be devoted to describing the use of the basic circuit in various logic circuit. In these logic circuits like elements to those shown in FIG. 1 will have the same reference designation.

One modification of the basic circuit is shown in FIG. 3 wherein a transistor 60 is connected in parallel with the transistor 20. The transistor 60 has a collector electrode 62 and an emitter electrode 64 which are connected to the corresponding electrodes of the transistor 20. An input circuit is connected to base electrode 66 of the transistor 60. The input to the base electrode 66 and the input to the base electrode 24 will be designated A and B, respectively, for convenience in explanation. Also included in the circuit of FIG. 3 is an inhibit transistor 68 having a collector electrode 70 connected to a voltage supply of suitable polarity, an emitter electrode 72 connected to the corresponding electrode of the transistor 28 and an input circuit connected to base electrode 74. The input signal will be designated by the letter C for convenience in explanation. Normally, the transistors 20, 66 and 68 have input signal levels which place these transistors in a non-conducting condition. When either the A or B, or both, inputs are negative (for PNP transistors only) the output is $\overline{A}$ or $\overline{B}$ since the voltage at the collector circuit rises toward ground or the supply voltage of the source 38. When both A and B inputs are removed, the output voltage falls toward that of the source 48, and the transistors return to the non-conducting condition. During the time the negative A or B, or both, input signals are applied, a C signal applied to the transistor 68 bypasses current from the transistor 28 to the transistor 68. As a result the output voltage is substantially equal to that of the source 48 since hardly any current flows in the emitters of transistors 20 and 60. Thus, C input signals inhibit the output signal normally produced when the A and B signals are applied. The combined output for the A, B and C inputs may be logically expressed by the relation $(\overline{A}+\overline{B})C$. Functionwise, such a circuit is conventionally referred to as an inhibited NOR circuit.

The circuit of FIG. 1 may be arranged for a true output signal as well as an inverted signal. Such a circuit is shown in FIG. 4 and has an output circuit at the emitter instead of the collector as in the previous case. To aid in a sharp output signal, a pair of series aiding tunnel diodes 76 and 78 are connected at their common point to the output circuit. The other terminal of the diode 76 is connected to a voltage supply 80 of suitable polarity, whereas the other terminal of the diode 78 is connected to a reference potential 82, typically ground.

The operation of the circuit will be described in conjunction with a current-voltage graph of the output circuit. Referring to FIG. 5, a curve 84 indicates the combined characteristic of the tunnel diodes 76 and 78. Tunnel diodes are well-known in the art, being described, for example, in an article entitled "New Phenomena in Narrow Germanium P-N Junction," Physical Review, volume 109, 1958, pages 602, 603. Operation of the diodes in this configuration is also well-known, being described, for example, in a publication entitled "IBM Technical Disclosure Bulletin," volume 4, No. 2, July 1961, IBM, New York, N.Y., page 55. The collector characteristic of the transistor 28 establishes a load line 86 for the combined diode operation. When the transistors 20 and 60 are cut off and the transistor 28 is saturated, current flows through the latter and into the diode 78. The voltage at the common node rises toward the supply 38, resulting in the diode 76 being in the low voltage condition and the diode 78 being in the high voltage condition. The stable operating point for the combined diode is at a point 88, the intersection between the curves 86 and 84. The output voltage level is V1, that voltage which is associated with the operating point 88. When either the A or B inputs are turned on, current is removed from the node of the diodes 76 and 78 and the voltage at the node falls towards the supply 48. As a result, the diode 76 switches to the high voltage condition and the diode 78 switches to the low voltage condition. In effect, the load line 86 is shifted to a new position 86′ which establishes an operating point 90 at a voltage V2 which is lower for the operating point 88. On release of either or both of the input signals, the operating point 88 and the corresponding output level are reestablished. Thus, the output signal follows the input signal and may be logically expressed by the relationship $A+B$ for input signals $A+B$. The circuit also functions as a storage circuit since the output signal is held by the tunnel diode so long as one of the input signals is present.

Another embodiment of the present invention which provides either true or complement signals is shown in FIG. 6. The circuit includes the transistors 20 and 28 described in connection with FIG. 1 and the inhibit transistor 60 described in connection with FIG. 3. Also included in the circuit is a transistor 92 having a collector 94 connected through a suitable resistor to a supply voltage 70 of suitable polarity. For PNP transistor the supply voltage 70 is negative. An output signal appears at the collector 94. The transistor 92 also includes a base electrode 96 connected to a reference potential, typically ground, and an emitter 98 directly connected to the base of the transistor 28. In the absence of an input signal, the transistor 20 is off and the majority of the current flow in the saturated transistor 28 is directed to the transistor 92 which is biased for conduction. As a result, the voltage level at the collector of the transistor 20 approaches that of the supply 48 whereas that at the collector of the transistor 92 approaches that of the supply 38. When an input signal is supplied, the transistor 20 is turned on and shunts most of the current from the transistor 28 to turn off the transistor 92. The voltage at the collector of the transistor 92, therefore, falls towards the supply voltage 70, whereas the voltage at the collector of the transistor 20 rises towards that of the supply voltage 38. Thus the former collector follows the input signal whereas the latter collector inverts the input signal. The circuit of FIG. 6, therefore, provides both true and complement output signals with respect to an input signal. The transistor 60 functions in the manner previously described, that is, in the presence of an input signal the output signal is inhibited at either the collector of the transistors 20 or 92.

Although the circuit shown in FIG. 6 has indicated a single inverting transistor 20, it is also apparent that a plurality of transistors may be connected in parallel with the transistor 20, as in the case of FIG. 3, to obtain a NOR output.

Connecting a pair of inhibited NOR circuits to a common supply produces a current switching Exclusive-OR as indicated in FIG. 7. The circuit includes transistors 20, 28 and 60 as one section of the circuit and transistors 20′, 28′ and 60′ as the second section of the circuit. The operation of the circuit for input signals A and B is described in the tabulation shown in FIG. 7A. As indicated therein, a pair of like signals produces no output signal whereas a pair of unlike signals produces an output signal. Assuming that no input signal is present at either the A or B input terminals, transistors 20 and 20′ are cut off and the output signal approaches that of the supply 48. Similarly, when the A and B input signals are applied to transistors 20 and 20′, the inhibit transistors 60 and 60′ are also turned on causing the current to be shunted from the transistors 20 and 28 as well as 20′ and 28′, resulting in the output voltage being unaffected by the signals. An A input signal alone or a B input signal alone results in one section of the Exclusive-OR being turned on and the other section being turned off. The input signal turns on the transistor 20 or 20′ as the case may be but also turns on the inhibit transistor 60 or 60′. Accordingly, the output voltage rises towards the supply 38. Thus the output signal follows the input signal when unlike signals are applied to the transistors 20 and 20′ or is unchanged when like signals are applied as an input.

Not only may the basic circuit be employed in binary logic circuitry but it also has application to three level logic circuitry. Such a circuit is shown in FIG. 8 and includes a transistor 100 connected in parallel with the transistor 28. The transistor 100 includes an emitter electrode 102 connected through a suitable resistor 103 to the supply 38, a collector electrode 104 connected to the collector electrode 30 and one terminal of a diode 106, and a base electrode 108 for receiving a bias voltage which is at a higher level than that applied to the base 40 of the transistor 28. The transistor 100, therefore, normally operates in a manner similar to the transistor 28. The circuit of FIG. 8 responds to positive, negative and ground input signals.

Operation of this circuit will be described in connection with FIG. 9 which is a graph of the current voltage relation appearing at the collector of the transistor 20. For a positive input signal 120, transistor 20 is cut off and little or no current flows to the collector. As a result, the output voltage falls towards the supply 48 and the current is reduced to a level 110 shown in FIG. 9. A ground signal 122 applied to the transistor 20 increases the current flow therethrough since both the transistors 28 and 100 are in the saturated condition. The diode 106, however, prevents current flow from the transistor 100 to the transistor 28. The output voltage decreases and the output current increases to a level 112 indicated in FIG. 9. A negative input signal 124 turns the transistor 20 full on, resulting in the transistors 28 and 100 being driven out of saturation. The current through the transistor further increases to a level 114 indicated in FIG. 9 and the output voltage rises towards the supply 38. Thus, the output signal is inverted with respect to the input signal so that the present circuit may be defined as a three level inverter. It is apparent, however, that the circuit may be modified in accordance with the principles described in the previous circuits to have a true output as well as an inverted output.

In summary, the present invention has shown and described a basic switching circuit which has fast turn-on and turn-off due to the ability to receive a signal of considerable overdrive. The output signal is independent of the input signal which permits low voltage power supplies with resultant reduced power dissipation. A wide variety of logical circuits is possible, both from a function standpoint as well as the number of possible information states.

It should be noted that although the present invention has been described with PNP transistors as the signal translating element, NPN transistors may be substituted for the PNP provided the polarities of bias supplies are changed.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A non-saturating inverter comprising: a transistor having an input and first output circuits normally operating in a saturated condition; a load impedance having controllable current requirements connected in the first output circuit of the transistor; a second output circuit connected to the load impedance; and means for varying the load impedance current requirements connected to the load impedance, said current varying means adapted to drive the transistor from a saturated condition to a non-saturated condition to provide a controlled current in the output circuit, said controlled current being independent of the current varying means of the load impedance.

2. A transistor switching circuit comprising: a first transistor having a collector, first biasing base and emitter electrodes; means connected to the transistor, said first biasing means adapted to operate the transistor in a saturated condition; a second transistor having collector, base and emitter electrodes, said second transistor being connected in the collector circuit of said first transistor; and second biasing means connected to said second transistor, said second biasing means adapted to operate the second transistor in a normally cut-off condition whereby said second transistor appears as an infinite load to said first transistor; said second transistor being responsive to an input signal to drive said first transistor out of saturation to provide a controlled current at the collector of said second transistor.

3. A transistor switching circuit comprising a current supply, a transistor having first, second and third electrodes, said first electrode connected to said current supply, biasing means connected to said third electrode, load means having a plurality of terminals, said load means connected to said second electrode, said load means having a controllable conducting condition, an output circuit connected to said load means, said biasing and load means cooperating normally to operate the transistor in a saturated current condition, and input means connected to said load means, said input means adapted to place the load means in a conducting condition to operate the transistor in a non-saturated current condition and provide an output signal to the output circuit.

4. A transistor switching circuit comprising a current supply, a transistor having first, second and third electrodes, said first electrode connected to said current supply, biasing means connected to said third electrode, load means having a plurality of terminals, said load means connected to said second electrode, said load means having a controllable conducting condition, an output circuit connected to said load means, said biasing means and load means cooperating normally to operate the transistor in a saturated condition at a first current level, and input means responsive to an input signal, said input means connected to said load means and adapted to place the load means in a conducting condition to operate the transistor in a nonsaturated condition at a second current level when the input signal is present, said second current level being independent of the magnitude of the input signal, the load means providing an output signal to the output circuit when conducting.

5. A transistor switching circuit comprising a current supply, a first transistor having a first, second and third electrode, said first electrode connected to said current supply, a reference potential connected to said third electrode, a second transistor connected to said second electrode, an output circuit connected to the second transistor, said reference potential and second transistor cooperating normally to operate the first transistor in a saturated condition at a first current level, and input means connected to said second transistor, said second transistor responsive to an input signal to place the second transistor in a nonsaturated condition at a second current level and provide an output signal to the output circuit, said second current level being constant regardless of the magnitude of the input signal, said first transistor permitting the input means to supply a large turn-off current to the second transistor when the input signal is removed thereby aiding in turning off of the second transistor.

6. A transistor switching circuit comprising a current source, a first transistor having collector, base and emitter electrodes, the emitter electrode connected to the current source, a bias means connected to the base electrode, an output terminal connected to the collector electrode, a plurality of signal translating elements having first, second and third electrodes, the first electrodes coupled to the output terminal, the second electrodes coupled to a supply voltage, an input circuit connected to each third electrode, each signal translating element being normally cut off and establishing a load to operate said first transistor in a saturated conducting condition, a bistable circuit having an input and an output circuit, said bistable circuit biased to be in one of two stable conditions, the bistable input circuit being connected to the output terminal, each signal translating element responsive to an input signal which changes the signal translating element from nonconducting to conducting and adjusts the load to operate the first transistor in a non-saturated constant current condition, the bistable circuit adapted to switch from the one stable condition to the second stable condition when a signal translating element conducts.

7. A transistor switching circuit comprising a current source, a first transistor having emitter, base and collector electrodes, the emitter electrode connected to the current source, a source of reference potential connected to the base electrode, an output terminal connected to the collector electrode, a plurality of transistors having first, second and third electrodes, all first electrodes connected to the output terminal, all second electrodes connected to an output circuit, input means connected to each third electrode, each input means adapted normally to operate the associated transistor in a nonconducting condition, the plurality of transistors establishing a load normally to operate the first transistor in a saturated conducting condition, each input means responsive to an input signal to change the associated transistor to a conducting condition and modify the load to operate the first transistor in a non-saturated constant current conducting condition, and inhibit means connected to the current source, said inhibit means responsive to an input signal to terminate conduction through the first transistor when the input signal is present at one or more of the plurality of transistors.

8. A transistor switching circuit comprising a current source including a first transistor, said current source having first and second output terminals, a second transistor having base, emitter and collector electrodes, the second emitter electrode connected to the first output terminal, a source of reference potential connected to the second base electrode, a first output circuit connected to the second collector electrode, a third transistor comprising base, emitter and collector electrodes, the third emitter electrode connected to the second output terminal, an input circuit connected to the third base electrode, and a second output circuit connected to the third collector electrode, said third transistor normally biased in a nonconducting condition and establishing a load to operate the first transistor in a saturated current condition, said third transistor providing a first signal level at the second output circuit, the first transistor providing current to the second transistor to establish a second signal level at the first output circuit, the third transistor responsive from input signal to change from nonconducting to conducting and place the first transistor in a non-saturated current condition, the conduction of the third transistor terminating current to the second transistor which changes the first output to the second level and establishes the first level signal output at the second output circuit.

9. A transistor switching circuit comprising a current source having first and second output terminals, two identical switching sections, each switching section comprising first, second and third transistors, each transistor having base, emitter and collector electrodes, the first emitter and second collector electrodes of each section connected together, the first collectors connected to an output circuit, first and second input circuits, the first input circuit connected to first and third base electrodes of the first and second sections, respectively, the second input circuit connected to the first and third base electrodes of the second and first sections, respectively, the second base electrodes connected to biasing means, the second and third emitter electrodes of each section connected through an impedance to a voltage supply, and the third collectors connected to a voltage supply, like input signals supplied to the first and second input circuits adapted to prevent current flow through the first transistor to provide a first output signal at the output circuit, unlike input signals supplied to the first and second input circuits adapted to permit current flow in one first transistor and prevent current flow in the other first transistor to provide a second output signal at the output circuit.

10. A transistor switching circuit comprising a current source including first and second impedance elements, a first transistor having base, emitter and collector electrodes, the first emitter electrode connected to the first impedance, a source of reference potential connected to the first base electrode, an output terminal including an asymmetric impedance connected to the first collector electrode, a second transistor having base, emitter and collector electrodes, the second emitter electrode connected to the second impedance, a source of bias potential connected to the second base electrode, a second output terminal connected to the second collector electrode, a third transistor having base, emitter and collector electrodes, the third emitter electrode connected to the first and second output terminals, an input circuit connected to the third base electrode, an output circuit connected to the third collector electrode, a first level signal to the input circuit rendering the third transistor nonconducting and the first and second transistors conducting at different levels, the nonconducting third transistor providing a third level current signal at the output circuit, a second level signal to the input circuit rendering the third transistor slightly conducting and the first and second transistors conducting in a saturated condition, the slightly conducting third transistor providing a second level current signal at the output circuit, a third level signal to the input signal rendering the third transistor highly conducting and the first and second transistor conducting in a non-saturated condition, the highly conducting third transistor providing a first level current signal at the output circuit.

11. A transistor switching circuit comprising a current supply including a first transistor and having an output terminal, a second transistor having emitter, a base and collector electrodes, the emitter electrode connected to the output terminal, an input circuit connected to the base electrode, an output circuit connected to the collector electrode, means biasing the first and second transistors to be in a saturated current and a nonconducting condition, respectively, said second transistor responsive to a first input signal which changes the second transistor to a conducting condition and places the first transistor in a non-saturated constant current condition, the output circuit providing an output signal when the second transistor is conducting, and signal translating means connected to the current supply, said signal translating means responsive to a second input signal to inhibit the second transistor from conducting when the first input signal is applied to the second transistor.

References Cited in the file of this patent

UNITED STATES PATENTS

| | | |
|---|---|---|
| 2,964,652 | Yourke | Dec. 13, 1960 |
| 2,983,831 | Walton | May 9, 1961 |